(12) United States Patent
Li et al.

(10) Patent No.: US 7,361,551 B2
(45) Date of Patent: Apr. 22, 2008

(54) METHOD FOR MAKING AN INTEGRATED CIRCUIT HAVING AN EMBEDDED NON-VOLATILE MEMORY

(75) Inventors: Chi-Nan B. Li, Austin, TX (US); Cheong M. Hong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 199 days.

(21) Appl. No.: 11/355,822

(22) Filed: Feb. 16, 2006

(65) Prior Publication Data
US 2007/0190720 A1 Aug. 16, 2007

(51) Int. Cl.
*H01L 21/336* (2006.01)
(52) U.S. Cl. .................. 438/257; 438/258; 438/275; 438/296; 438/300; 438/303; 438/305; 257/E21.682
(58) Field of Classification Search .................. None
See application file for complete search history.

(56) References Cited

U.S. PATENT DOCUMENTS 4,906,589 A * 3/1990 Chao .................. 438/305
6,528,376 B1 * 3/2003 Guo .................. 438/302

* cited by examiner

*Primary Examiner*—Michael Lebentritt
*Assistant Examiner*—Kyoung Lee
(74) *Attorney, Agent, or Firm*—Daniel D. Hill; Michael Balconi-Lamica

(57) ABSTRACT

A method for forming a portion of a semiconductor device includes: patterning gate stack layers overlying a substrate into a gate stack; implanting dopant ions to form shallow source/drain extension implant regions in the substrate adjacent to the gate stack; oxidizing the gate stack at first oxidation conditions to form an oxidation layer on sidewalls of the gate stack; and oxidizing the gate stack at second oxidation conditions to form further oxidation of the oxidation layer on sidewalls of the gate stack. The second oxidation conditions are different from the first oxidation conditions.

20 Claims, 3 Drawing Sheets

US 7,361,551 B2

METHOD FOR MAKING AN INTEGRATED CIRCUIT HAVING AN EMBEDDED NON-VOLATILE MEMORY

FIELD OF THE INVENTION

The present invention relates generally to integrated circuits, and more particularly, to an embedded non-volatile memory (NVM) and method therefor.

BACKGROUND OF THE INVENTION

A flash memory cell is a type of non-volatile memory (NVM) cell that stores charge in a charge storage region, for example, a floating gate. The amount of charge on the floating gate determines a threshold voltage (VT) of the cell, hence the logic state stored by the cell. Each time the cell is programmed or erased, electrons are moved to or from the floating gate using a relatively high program or erasing voltage. The floating gate is electrically isolated so that charge is stored indefinitely. Non-volatile memory is commonly implemented, or embedded, on an integrated circuit that also includes logic circuits implemented with a conventional metal-oxide semiconductor (MOS) process. When embedding a non-volatile memory, such as for example, a flash memory having floating gate transistors, the embedded memory is formed using different manufacturing steps than the logic circuits. Frequently, the manufacturing process for the NVM that is embedded on an integrated circuit with logic circuits is not compatible with the manufacturing process used to form the logic circuit transistors. This is due in part because the logic circuits operate at a relatively lower voltage than the flash memory. In this case, one or both of the manufacturing processes must be changed. Also, as an integrated circuit manufacturing process advances, the minimum feature size of the devices on the integrated circuit may decrease. This reduction in minimum feature size, or scaling, may result in problems due to manufacturing process differences that did not cause a problem with the larger feature size.

Therefore, it is desirable to provide an integrated circuit having an embedded non-volatile memory without the above mentioned problems.

DETAILED DESCRIPTION

The process used to form an array of NVM cells is different from the process used to form another type of transistor, such as for example, a MOS transistor used in a logic circuit. To embed, or implement, an NVM array on an integrated circuit having MOS logic circuits, it is necessary to insure that the process steps used to form the NVM cells do not adversely affect the MOS transistors, and visa versa.

Generally, the present invention provides, in one form, a method for manufacturing an integrated circuit having an embedded non-volatile memory. After the formation of a memory cell transistor gate stack, shallow source and drain extension regions are implanted next to the sides of the gate stack. A channel region is defined under the gate stack. Heat from a first oxidation step is then used to partially drive and activate the shallow source and drain extension implants to form source and drain extension regions. A second oxidation step is used to complete the source and drain extensions of the memory cells. The first oxidation step also forms an oxide layer on the side of the NVM transistor gate stack. The second oxidation step is used in the formation of a logic circuit transistor on the integrated circuit to form an oxide layer on the side of the gate. By first providing shallow doped implants in the source and drain extension regions, heat used in the formation of a logic circuit transistor is then used to complete formation of the source and drain extension regions. The first oxidation step occurs at a first temperature for a first time duration, and the second oxidation step occurs at a second temperature for a second time duration, where the first time duration is different from the second time duration.

In another embodiment, a retrograde well is implanted and the first oxidation step drives the retrograde well toward a channel region of the memory cell gate stack. The source and drain extensions are then implanted, and the second oxidation step drives and activates the source and drain extension implants.

If the source and drain extension regions of the NVM cells were to be formed by implanting to the correct depth, then heating the integrated circuit may drive the implants further than desired, causing for example, an effective gate length of the NVM cells to be shorter than desired. A shorter effective gate length may lead to NVM cells that suffer from certain channel effects, such as for example, a lower than desired drain breakdown voltage when the gate is not biased. A lower drain breakdown voltage may lead to excessive current flow during program and erase operations.

Figure 1:
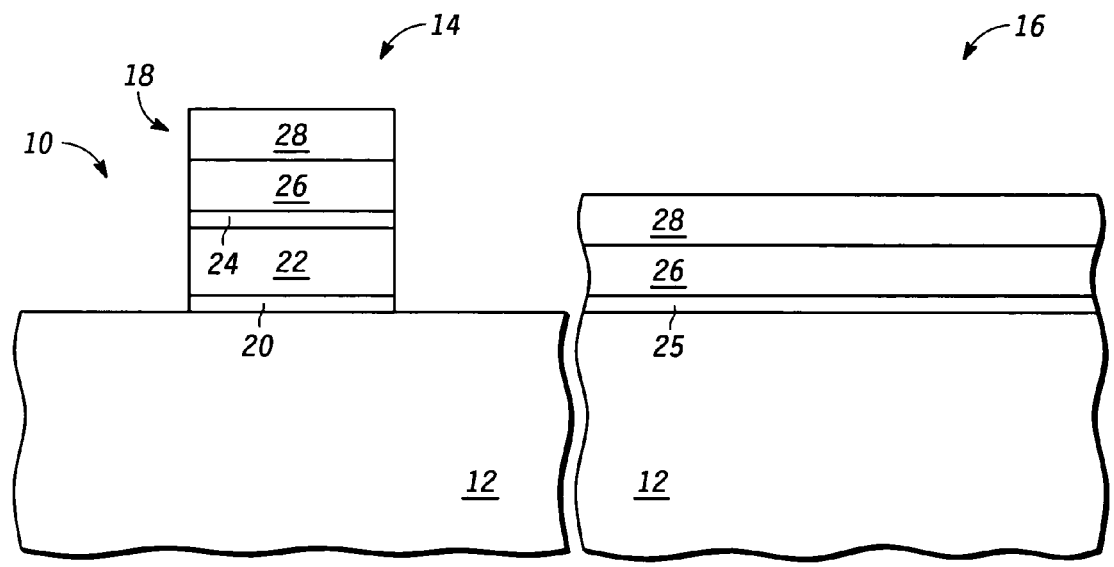
FIG. 1 illustrates a cross-sectional view of an integrated circuit having an embedded non-volatile memory after a memory cell gate stack is patterned in accordance with the present invention.

FIG. 1 illustrates a cross-sectional view of an integrated circuit 10 having an embedded non-volatile memory after a memory cell gate stack 18 is patterned in accordance with the present invention. The integrated circuit 10 includes a portion 14 for implementing an NVM array and a portion 16 for implementing relatively lower voltage logic circuit transistors. The logic circuit portion 16 includes an insulating layer 25 formed on the substrate 12. The NVM portion 14 includes a plurality of NVM cells that are typically organized in rows and columns (not shown). Each of the NVM cells includes a gate stack. Gate stack 18 is representative of the gate stacks of the plurality of NVM cells and includes a tunnel oxide layer 20 formed on the silicon substrate 12, a charge storage layer 22, an insulating layer 24, and conductive layer 26. The charge storage layer 22 is formed on the tunnel oxide layer 20. In the illustrated embodiment, the charge storage layer 22 includes polysilicon. Also in the illustrated embodiment, the charge storage layer 22 is characterized as being a floating gate. In another embodiment, the charge storage layer 22 may include, for example, nitride or nanocrystals.

The insulating layer 24 is formed on charge storage layer 22. In the illustrated embodiment, the insulating layer 24 may include multiple layers and preferably is an oxidenitride-oxide (ONO) layer forming an insulating layer between the control gate and the floating gate. An insulating layer 25 is formed on portion 16 and functions as a gate dielectric layer for the MOS logic transistors formed on portion 16. The conductive layer 26 is then formed over the insulating layers 24 and 25. The conductive layer 26 is formed from polysilicon having a thickness of about 1000 angstroms in the illustrated embodiment and functions as the control gates of the NVM array in the portion 14 and the gates of the logic transistors in portion 16. An anti-reflective coating (ARC) 28 is formed over the conductive layer 26 in both of portions 14 and 16. The material used to from ARC 28 is conventional in the industry and may be organic or inorganic. The ARC 28 is formed to a thickness of about 155 Angstroms. The gate stack layers are then patterned as illustrated in FIG. 1 to form the gate stack 18.

Figure 2:
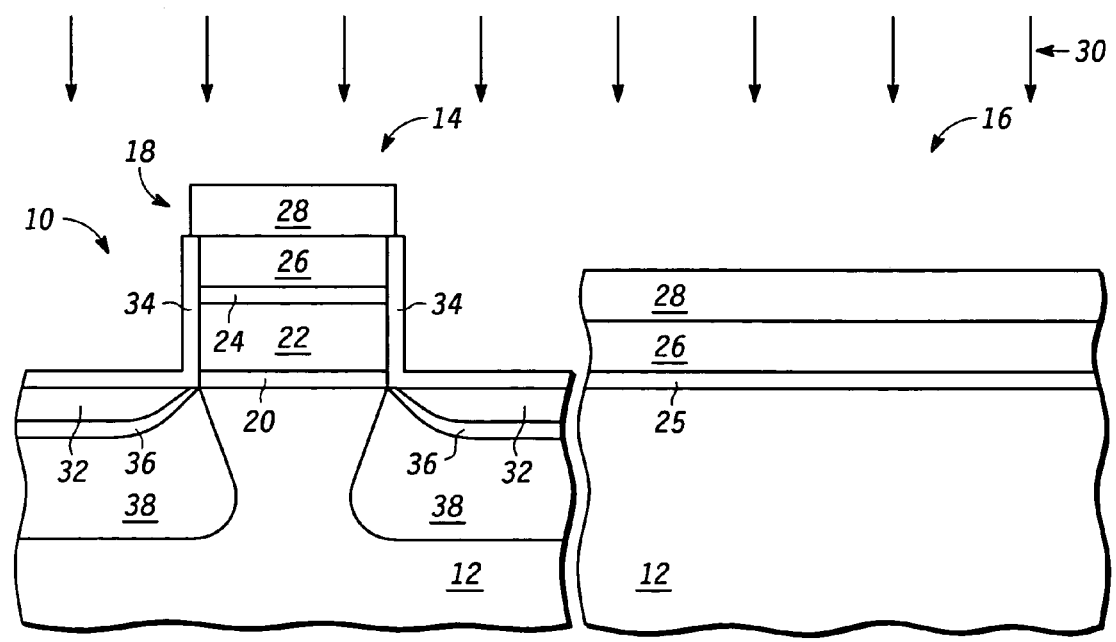
FIG. 2 illustrates a cross-sectional view of the integrated circuit of FIG. 1 after implanting source and drain extension regions and a retrograde well region for the memory cell and after a first oxidation.

FIG. 2 illustrates a cross-sectional view of the integrated circuit 10 of FIG. 1 after implanting source and drain regions for the memory cell gate stack 18. Shallow source and drain and extensions 32 are formed by implanting dopant ions of, for example, arsenic (As). The extensions 32 are implanted by subjecting integrated circuit 10 to an energy 30. Optionally, a halo implant 36 may be formed in substrate 12 at this time. Also optionally, retrograde well implants 38 may be formed by doping substrate 12 with Boron (B). Angled implants may be formed extending the retrograde well implants 38 underneath the gate stack 18 as illustrated in FIG. 2. The retrograde well may be used in an embodiment that requires, for example, a threshold voltage (VT) adjustment. The halo implants 36 extend substantially deeper than the source and drain extensions 32 and above the retrograde implants 38. The halo implants 36 may be formed prior to or after the formation of the shallow source/drain extensions 32.

An oxide 34 is formed on the sides of gate stack 18 and on the surface of substrate 12 by oxidizing the substrate 12 and the polysilicon layers 22 and 26. To form the oxide layer 34, the integrated circuit 10 is heated, in one embodiment, to a temperature in a range of between 700 to 1100 degrees Celsius, and preferably about 900 degrees until about 20 to 150 Angstroms of oxide are formed on the surface of substrate 12. The amount of time required to form the desired amount of oxide is dependent on, for example, the temperature and polysilicon content and thickness. Typically, the oxide layer 34 is thicker on the sides of gate stack 18 than on the surface of substrate 12. Oxidizing the NVM gate stack at the above oxidation conditions drives the dopant ions to a first depth within the substrate to form the shallow source/drain extension regions 32 and provide a first effective channel length underlying the NVM gate stack. The source and drain regions are also driven laterally in substrate 12 (not shown). The oxidation step used to form oxide 34 is sometimes referred to as a poly re-oxidation. In addition to forming the oxide layer 34, heating the integrated circuit 10 drives and activates the shallow source and drain implant extensions 32. The oxide layer 34 is only grown on the NVM portion 14. ARC layer 28 prevents oxide from growing on logic circuit portion 16 and on the top of gate stack 18. In another embodiment, the dopant ions used to form the shallow source/drain extension implant regions 32 are implanted subsequent to the oxidizing of the NVM gate stack 18 at the first oxidation conditions, instead of prior to oxidizing of the NVM gate stack 18 at the first oxidation conditions.

Figure 3:
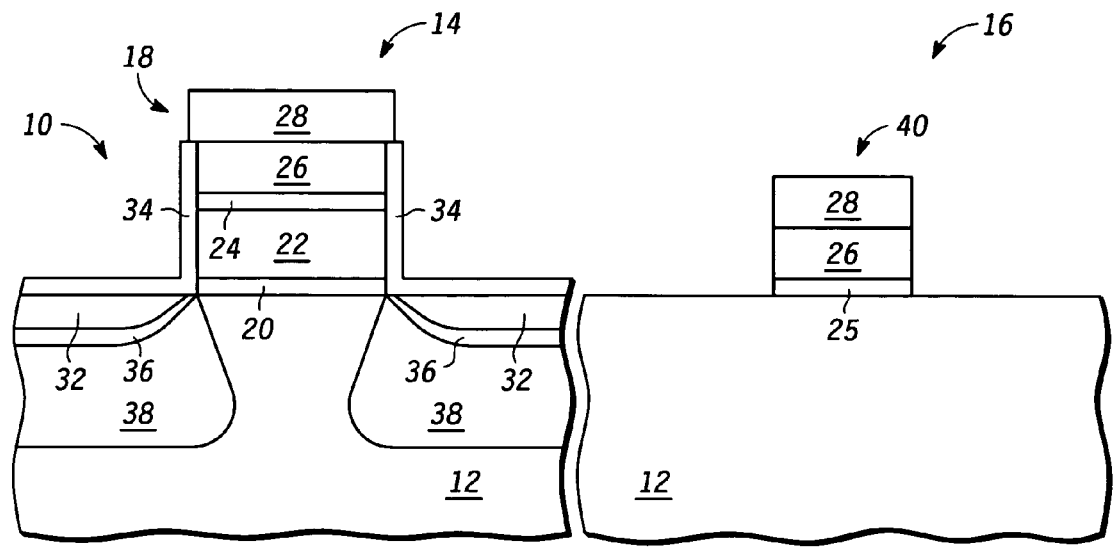
FIG. 3 illustrates a cross-sectional view of the integrated circuit of FIG. 2 after the logic circuit transistor gates are patterned.

FIG. 3 illustrates a cross-sectional view of the integrated circuit 10 of FIG. 2 after a logic circuit transistor gate stack 40 is patterned by removing portions of insulating layer 25, conductive layer 26, and ARC layer 28. Gate stack 40 is representative of a plurality of gate stacks that would be formed in the logic circuit portion 16.

Figure 4:
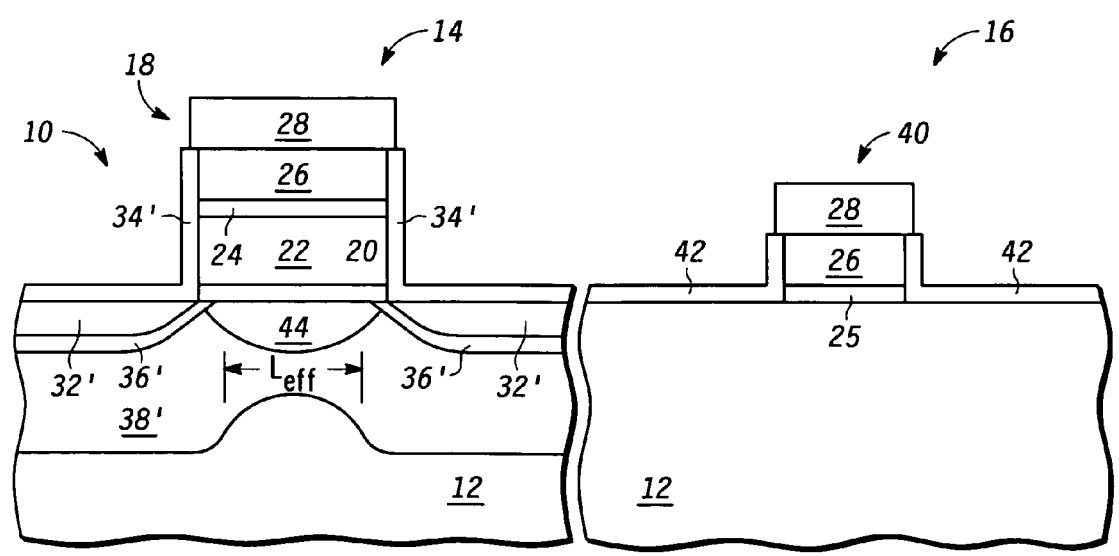
FIG. 4 illustrates a cross-sectional view of the integrated circuit of FIG. 3 following retrograde well formation.

FIG. 4 illustrates a cross-sectional view of the integrated circuit 10 of FIG. 3 following a second oxidation step. The second oxidation step is part of the process used to form the MOS transistors in portion 16. The second oxidation step is used to form an oxide layer 42 on the surface of substrate 12 in portion 16 and on the sides of gate stack 40. The second oxidation step is also used to extend the retrograde well 38 completely under the gate stack 18 to form a merged retrograde well 38'. The merged retrograde implant regions 38' has a bow-tie shaped profile underlying the NVM gate stack as illustrated in FIG. 4. A retrograde free region 44 is formed over the modified retrograde well 38' directly underlining the gate stack 18. The retrograde free region 44 may be doped with an N-type material to lower the transistor's VT. Also, the second oxidation step drives the dopant ions to a greater depth and causes the shallow source and drain extensions 32 and halo extensions 36, formed in FIG. 2, to extend further underneath the gate stack 18 to form modified shallow source and drain extensions 32' and modified halo extensions 36', thus further reducing the effective channel length under the gate stack 18. In addition, the second oxidation step further oxidizes insulating layer 34 to form a modified insulating layer 34'. The effective gate length of the NVM cells is the distance between the source and drain extensions and is labeled "$L_{EFF}$" in FIG. 4. The second oxidation step involves heating the integrated circuit to a temperature of between 600 to 1100 degrees Celsius, in one embodiment, and preferably about 800 degrees, until about 10 to 100 Angstroms of oxide 42 are formed on the surface of substrate 12 and the side of gate stack 40. Also, source and drain extensions (not shown) may be formed for the logic circuit transistors of portion 16 at this time.

Figure 5:
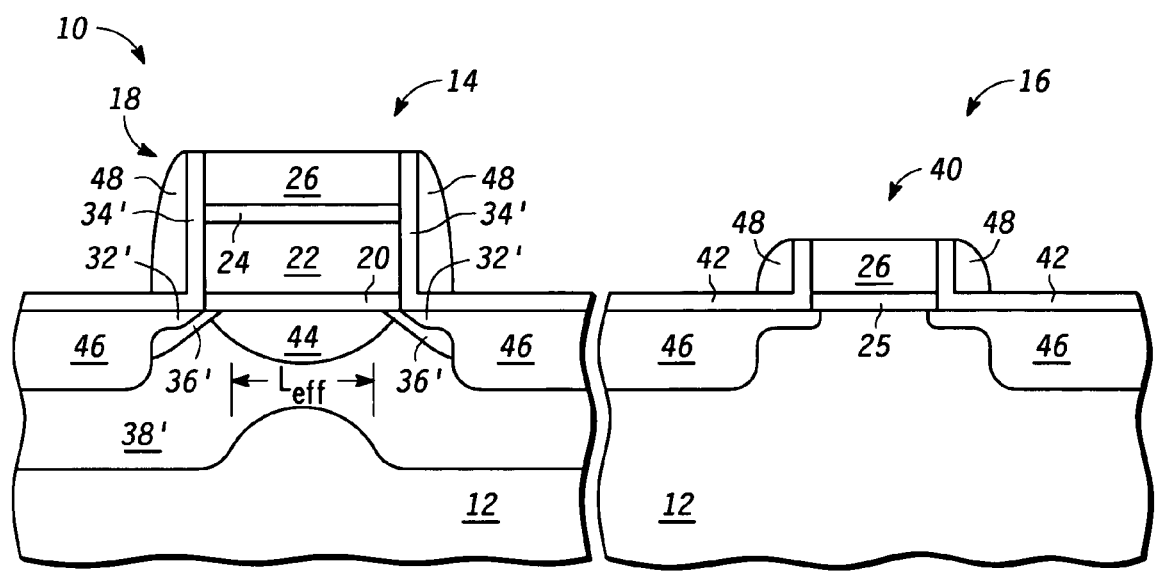
FIG. 5 illustrates a cross-sectional view of the integrated circuit of FIG. 4 after further processing.

FIG. 5 illustrates a cross-sectional view of the integrated circuit of FIG. 4 after further processing to complete NVM cells and logic circuit transistors. For example, the integrated circuit 10 is further processed to form sidewall spaces 48 on the sides of gate stack 18 and on gate stack 40. Also, after the spacers 48 are formed, a deep implant of Arsenic and Phosphorus is used in the illustrated embodiment to form completed source and drain regions 46 for both the NVM portion 14 and the logic circuit portion 16. Additionally, further processing includes the formation of multiple interlevel dielectric layers (not shown) alternating with metal conductors (not shown) may be formed over the NVM portion 14 and the logic portion 16. Contacts are formed between each drain, source, and gate to connect to one or more metal layers (not shown).

By first providing shallow doped implants in the source and drain extension regions 32 of the NVM portion 14, heat used in the oxide formation for a logic circuit transistor of portion 16 is used to complete formation of the source and drain extension regions 46 in the NVM portion 14. Using the oxidation layer formation of portion 14 to drive and activate the source and drain regions of NVM portion 14 results in NVM cells that can be scaled to have the desired LEFF without causing short channel effects such as a reduced drain breakdown voltage.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming an embedded non-volatile memory (NVM) comprising:
   patterning NVM gate stack layers overlying a substrate into an NVM gate stack;
   implanting dopant ions to form shallow source/drain extension implant regions in the substrate adjacent to the NVM gate stack;
   oxidizing the NVM gate stack at first oxidation conditions to form an NVM oxidation layer on sidewalls of the NVM gate stack; and
   oxidizing the NVM gate stack at second oxidation conditions to form further oxidation of the NVM oxidation layer on sidewalls of the NVM gate stack, the second oxidation conditions differing from the first oxidation conditions.

2. The method of claim 1, wherein oxidizing the NVM gate stack at the first oxidation conditions drives the dopant ions to a first depth within the substrate to form shallow source/drain extension regions and provide a first effective channel length underlying the NVM gate stack, and wherein oxidizing the NVM gate stack at the second oxidation conditions drives the dopant ions to a second depth greater than the first depth and reduces the first effective channel length to a second effective channel length smaller than the first effective channel length.

3. The method of claim 2, further wherein the first depth includes both a vertical and a lateral dimension, and the second depth includes both a vertical and a lateral dimension.

4. The method of claim 1, wherein the implanting of dopant ions to form the shallow source/drain extension implant regions occurs subsequent to the oxidizing of the NVM gate stack at the first oxidation conditions, instead of prior to oxidizing of the NVM gate stack at the first oxidation conditions.

5. The method of claim 1, wherein prior to implanting dopant ions to form the shallow source/drain extension implant regions in the substrate adjacent the NVM gate stack, the method further comprising:
   implanting retrograde dopant ions to form retrograde implant regions, wherein the retrograde implant regions are substantially formed below the shallow source/drain extension implant regions in the substrate.

6. The method of claim 5, further comprising the retrograde implant regions merge in response to oxidizing the NVM gate stack at the second oxidation conditions, the merged retrograde implant regions having a bow-tie shaped profile underlying the NVM gate stack.

7. The method of claim 5, wherein the implanting of dopant ions to form the shallow source/drain extension implant regions occurs subsequent to the oxidizing of the NVM gate stack at the first oxidation conditions, instead of prior to oxidizing of the NVM gate stack at the first oxidation conditions.

8. The method of claim 5, further comprising:
   implanting halo dopant ions to form halo implant regions, wherein the halo implant regions are substantially formed below the shallow source/drain extension implant regions in the substrate and above the retrograde implant regions.

9. The method of claim 8, wherein subsequent to the oxidizing of the NVM gate stack at the first oxidation conditions, instead of prior to oxidizing of the NVM gate stack at the first oxidation conditions, there occurs at least one selected from the group consisting of (i) implanting of dopant ions to form the shallow source/drain extension implant regions, (ii) implanting retrograde dopant ions to form retrograde implant regions, and (iii) implanting halo dopant ions to form halo implant regions.

10. The method of claim 1, further comprising:
    implanting halo dopant ions to form halo implant regions, wherein the halo implant regions are substantially formed below the shallow source/drain extension implant regions in the substrate.

11. The method of claim 10, wherein implanting halo dopant ions occurs prior to implanting dopant ions for the shallow source/drain extension implant regions.

12. The method of claim 1, wherein the first oxidation conditions include a first temperature and the second oxidation conditions include a second temperature, further wherein the first temperature is higher than the second temperature.

13. The method of claim 12, further wherein oxidizing at the first temperature occurs for a first time duration, and wherein oxidizing at the second temperature occurs for a second time duration, the first time duration differing from the second time duration.

14. A method of forming an embedded non-volatile memory (NVM) comprising:
    patterning NVM gate stack layers overlying a substrate into a NVM gate stack;
    implanting dopant ions to form shallow source/drain extension implant regions in the substrate adjacent the NVM gate stack;
    oxidizing the NVM gate stack at a first temperature to form an NVM oxidation layer on sidewalls of the NVM gate stack, wherein oxidizing the NVM gate stack at the first temperature drives the dopant ions to a first depth within the substrate to form shallow source/drain extension regions and provide a first effective channel length underlying the NVM gate stack; and
    oxidizing the NVM gate stack at a second temperature to form further oxidation of the NVM oxidation layer on sidewalls of the NVM gate stack, wherein oxidizing the NVM gate stack at the second temperature drives the dopant ions to a second depth greater than the first depth and reduces the first effective channel length to a second effective channel length smaller than the first effective channel length, the second temperature being less than the first temperature.

15. The method of claim 14, further wherein the first depth includes both a vertical and a lateral dimension, and the second depth includes both a vertical and a lateral dimension.

16. The method of claim 14, wherein the implanting of dopant ions to form the shallow source/drain extension implant regions occurs subsequent to the oxidizing of the NVM gate stack at the first oxidation conditions, instead of prior to oxidizing of the NVM gate stack at the first oxidation conditions.

17. A method of forming a portion of a semiconductor device comprising:
   patterning gate stack layers overlying a substrate into a gate stack;
   implanting dopant ions to form shallow source/drain extension implant regions in the substrate adjacent the gate stack;
   oxidizing the gate stack at first oxidation conditions to form an oxidation layer on sidewalls of the gate stack; and
   oxidizing the gate stack at second oxidation conditions to form further oxidation of the oxidation layer on sidewalls of the gate stack, the second oxidation conditions differing from the first oxidation conditions.

18. The method of claim 17, wherein oxidizing the gate stack at the first oxidation conditions drives the dopant ions to a first depth within the substrate to form shallow source/drain extension regions and provide a first effective channel length underlying the gate stack, and wherein oxidizing the gate stack at the second oxidation conditions drives the dopant ions to a second depth greater than the first depth and reduces the first effective channel length to a second effective channel length smaller than the first effective channel length.

19. The method of claim 18, wherein the gate stack layers comprise first gate stack layers that overlie a first portion of the substrate, further wherein second gate stack layers overlie a second portion of the substrate, the second gate stack layers differing from the first gate stack layers, the method further comprising:
   patterning, subsequent to oxidizing the first gate stack at the first oxidation conditions and prior to oxidizing the first gate stack at the second oxidation conditions, the second gate stack layers to form a second gate stack, and wherein oxidizing the first gate stack at the second oxidation conditions further includes oxidizing the second gate stack at the second oxidation conditions to form a second oxidation layer on sidewalls of the second gate stack.

20. The method of claim 19, wherein the first gate stack layers comprises NVM gate stack layers and wherein the second gate stack layers comprise low-voltage logic (LV logic) gate stack layers.

* * * * *